(12) United States Patent
Minami

(10) Patent No.: US 6,951,794 B2
(45) Date of Patent: Oct. 4, 2005

(54) SEMICONDUCTOR DEVICE WITH SPIRAL INDUCTOR AND METHOD FOR FABRICATING SEMICONDUCTOR INTEGRATED CIRCUIT DEVICE

(75) Inventor: Yoshihiro Minami, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 10/798,568

(22) Filed: Mar. 12, 2004

(65) Prior Publication Data

US 2004/0171227 A1 Sep. 2, 2004

Related U.S. Application Data

(62) Division of application No. 09/960,333, filed on Sep. 24, 2001, now Pat. No. 6,730,983.

(30) Foreign Application Priority Data

Sep. 28, 2000 (JP) ......................................... 2000-295823

(51) Int. Cl.$^7$ ......................... H01L 21/20; H01L 23/12; H01L 23/053; H01L 29/00; H01L 29/40
(52) U.S. Cl. ........................ 438/381; 257/531; 257/700; 257/621
(58) Field of Search ................................ 257/531, 532, 257/534, 535, 621, 700, 701; 438/381, 329

(56) References Cited

U.S. PATENT DOCUMENTS

| | | | |
|---|---|---|---|
| 5,742,091 A | | 4/1998 | Hebert |
| 5,918,121 A | | 6/1999 | Wen et al. |
| 6,002,161 A | * | 12/1999 | Yamazaki ..................... 257/531 |
| 6,057,202 A | * | 5/2000 | Chen et al. .................. 438/381 |
| 6,075,257 A | | 6/2000 | Song |
| 6,180,445 B1 | * | 1/2001 | Tsai ............................ 438/238 |
| 6,274,920 B1 | * | 8/2001 | Park et al. ................... 257/531 |
| 6,285,069 B1 | * | 9/2001 | Yoshida ....................... 257/531 |
| 6,452,249 B1 | * | 9/2002 | Maeda et al. ................ 257/531 |
| 6,720,229 B2 | * | 4/2004 | Norstrom et al. ............ 438/381 |

FOREIGN PATENT DOCUMENTS

| | | |
|---|---|---|
| JP | 03-82053 | 4/1991 |
| JP | 08-32039 | 2/1996 |
| JP | 10-321802 | 12/1998 |
| JP | 11-233727 | 8/1999 |
| JP | 2000-040786 | 2/2000 |
| JP | 2001-352039 | 12/2001 |

* cited by examiner

Primary Examiner—Nathan J. Flynn
Assistant Examiner—Victor A. Mandala, Jr.
(74) Attorney, Agent, or Firm—Oblon, Spivak, McClelland, Maier & Neustadt, P.C.

(57) ABSTRACT

A spiral inductor comprising: a substrate; a protruding portion which is formed on the top face of the substrate and the top of which serves as a dummy element for controlling a chemical mechanical polishing process; and a conductive layer which is formed on the substrate so as to have a spiral shape and which serves as an induction element, wherein the protruding portion is formed in a region other than a region directly below the conductive layer.

6 Claims, 10 Drawing Sheets

SEMICONDUCTOR DEVICE WITH SPIRAL INDUCTOR AND METHOD FOR FABRICATING SEMICONDUCTOR INTEGRATED CIRCUIT DEVICE

CROSS REFERENCE TO RELATED APPLICATIONS

This application claims benefit of priority under 35 U.S.C. §119 to Japanese patent application No. 2000-295823, filed on Sep. 28, 2000 and from U.S. application Ser. No. 09/960,333, filed Sep. 24, 2001 now U.S. Pat. No. 6,730,983, the contents of which are incorporated by reference herein.

BACKGROUND OF THE INVENTION

1. Field of the Invention

The present invention relates generally to a spiral inductor serving as an inductance element spirally formed on a substrate, and a method for fabricating a semiconductor integrated circuit device having the same.

2. Related Background Art

As one of inductance function elements provided in a semiconductor integrated circuit device (which will be simply hereinafter referred to as an IC), there is a so-called plane spiral inductor. This is designed to obtain a required inductance with such a structure that a plane spiral wiring is formed on a substrate.

However, if a plane spiral inductor is actually formed on a substrate, there is a problem in that it is not possible to sufficiently suppress a coupling between the spiral wiring and the substrate, so that part of high-frequency energy escapes into the substrate, thereby lowering characteristics (Q-value) of the inductor.

Referring to the accompanying drawings, this problem will be described below in detail. Furthermore, the same reference numbers are given to the dame portion in the following drawings, and the descriptions thereof will be suitably omitted.

FIG. 19 is a plan view showing an example of a conventional spiral inductor, and FIG. 20 is a sectional view of the spiral inductor taken along line A—A of FIG. 19.

A spiral inductor 100 shown in FIGS. 19 and 20 comprises: a substrate 1 having a dummy element 2, which will be described later, on its surface; an extracting wiring 5 which is formed on the substrate 1 via insulating films 3 and 4; a second layer wiring 7 which is formed on the substrate 1 via the extracting wiring 5 and an insulating film 6; and a protective film 9 which is formed so as to cover the second layer wiring 7. The extracting wiring 5 is formed in line by patterning using a photoresist. The second layer wiring 7 is formed so as to have a plane spiral shape by patterning using a photoresist. Of both end portions of the extracting wiring 5, an end portion on the center side of the spiral inductor 100 is connected to an end portion of the second layer wiring 7 on the center side of the spiral, and an end portion of the extracting wiring 5 on the peripheral side of the spiral inductor 100 is connected to a circuit element (not shown) in an IC. The spiral outermost end portion of the second layer wiring 7 is also connected to another circuit element (not shown) in the IC. Thus, a high-frequency circuit is formed.

In the surface of the substrate 1, an element isolating shallow groove is formed so that the remaining portions are protruding portions arranged in the form of islands. The top faces of these protruding portions form Si regions 2 about a few micrometers square. These Si regions 2 are called dummy elements. The shallow groove is filled with the insulating film 3, so that an STI (Shallow Trench Insulator) structure is formed. The reason why such dummy elements 2 are provided in the surface of the substrate is as follows.

The above described element isolation based on the STI is the mainstream element isolating system at present. In this STI isolating process, after the insulating film 3 filled in the element isolating groove, planarization is carried out by the chemical and mechanical polishing (which will be simply hereinafter referred to as CMP) technique. However, in this planarization process, if a wide field region (of about one hundred μm or more) exists on the surface of the substrate, a phenomenon called dishing that only the region is scraped off is caused. In order to solve such a problem in the planarization process, a method for arranging dummy elements in the form of islands is adopted. In particular, when a relatively large inductance, e.g., an inductance of a few nH, is required, the size of the spiral inductor is a few hundreds μm square, so that it is necessary to arrange dummy elements to prevent dishing.

However, if the dummy elements are provided, there are two new problems as follows.

First, as shown in FIG. 20, the distance between the dummy element 2 and the inductor wiring portions 5, 7 is shortened by a difference in level of the protruding portion, so that there is a problem in that part of high-frequency energy particularly passes through the dummy element 2 directly below the wiring to leak into the substrate 1.

Second, in recent semiconductor fabricating processes, the surface of Si is generally silicidated in order to enhance the performance of an active element. At this time, the surface of the dummy element 2 in the lower portion of the inductor is also silicidated. This means that a layer having a very low resistance is formed directly below the inductor, so that there is a problem in that characteristics (Q-value) of the inductor deteriorate.

SUMMARY OF THE INVENTION

According to a first aspect of the invention, there is provided a spiral inductor comprising: a substrate; a protruding portion which is formed on the top face of the substrate and the top of which serves as a dummy element for controlling a chemical mechanical polishing process; and a conductive layer which is formed on the substrate so as to have a spiral shape and which serves as an induction element, wherein the protruding portion is formed in a region other than a region directly below the conductive layer.

According to a second aspect of the invention, there is provided a spiral inductor comprising: a substrate; a protruding portion which is formed on the top face of the substrate and the top of which serves as a dummy element for controlling a chemical mechanical polishing process; a conductive layer which is formed on the substrate so as to have a spiral shape and which serves as an induction element; and a protective film which is formed between the substrate and the conductive layer and prevents silicidation of the protruding portion.

According to a third aspect of the invention, there is provided a method for fabricating a semiconductor integrated circuit device comprising a substrate, and a spiral inductor which is formed on the substrate and which includes a spiral conductive layer serving as an induction element, the method comprising: forming an element isolating groove in the surface of the substrate so that a protruding portion is formed in a region other than the region in which the conductive layer is formed, the top of the protruding portion serving as a dummy element for controlling a chemical mechanical polishing process.

According to a fourth aspect of the invention, there is provided a method for fabricating a semiconductor integrated circuit device comprising a substrate, and a spiral inductor which is formed on the substrate so as to have a spiral shape and which includes a conductive layer serving as an induction element, the method comprising: forming an element isolating groove in the surface of the substrate so that a protruding portion is formed, the top thereof serving as a dummy element for controlling a chemical mechanical polishing process; depositing a protective film on the substrate; selectively removing the protective film in a region other than a region in which the induction element is to be formed, by patterning using a photoresist; and silicidating the surface of the substrate.

DESCRIPTION OF THE EMBODIMENTS

Referring now to the accompanying drawings, some embodiments of the present invention will be described below.

(1) First Embodiment

Figure 1:
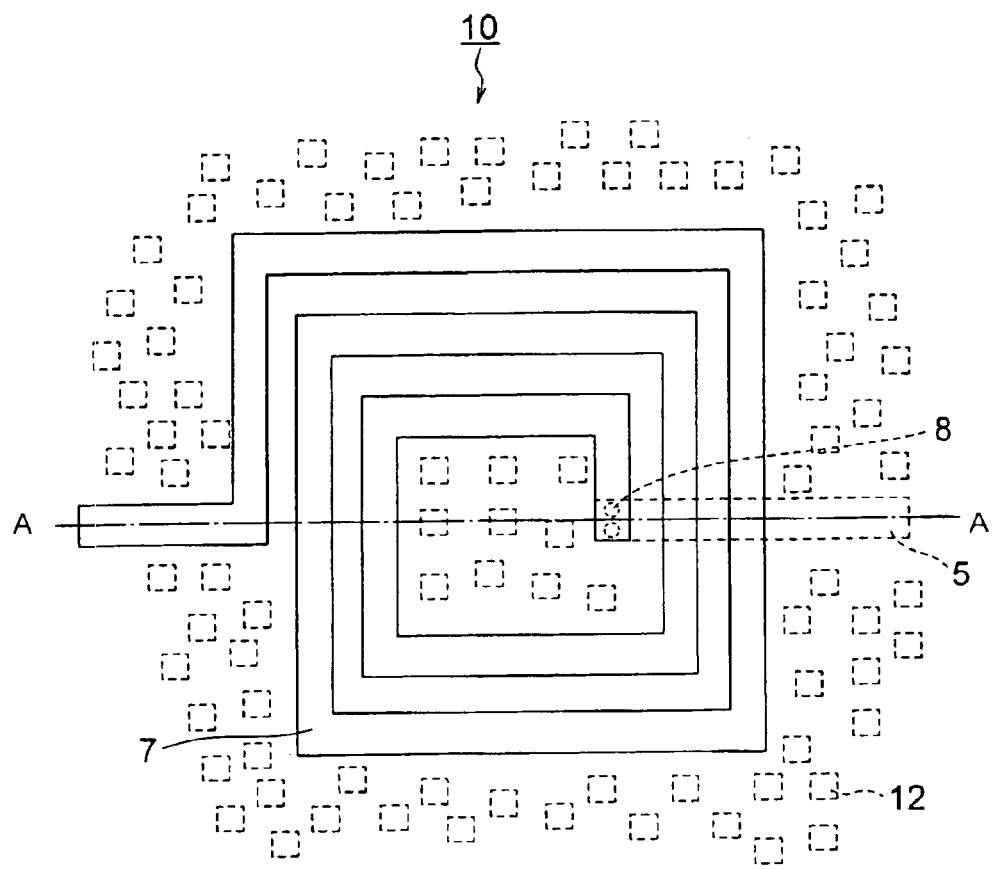
FIG. 1 is a plan view of the first embodiment of a spiral inductor according to the present invention.
Figure 2:
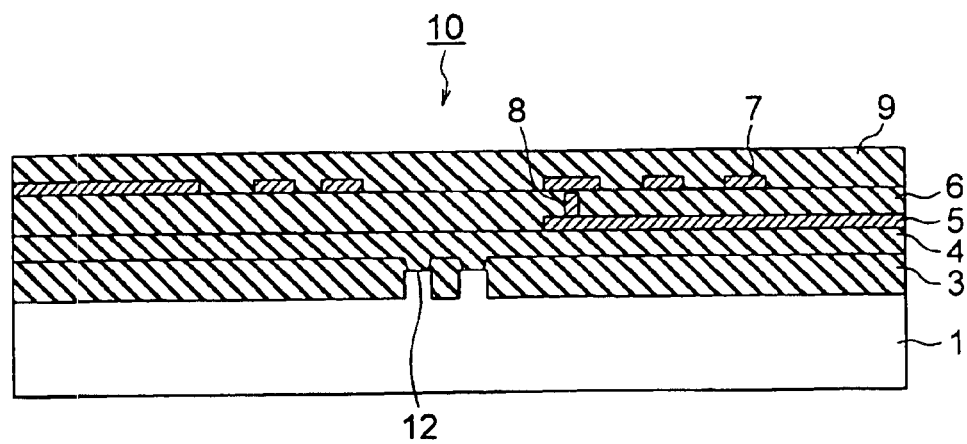
FIG. 2 is a schematic sectional view of the spiral inductor taken along line A—A of FIG. 1.

FIG. 1 is a plan view of the first embodiment of a spiral inductor according to the present invention, and FIG. 2 is a schematic sectional view taken along line A—A of FIG. 1.

As can be clearly seen from the comparison with FIGS. 19 and 20, the spiral inductor 10 shown in FIGS. 1 and 2 has a dummy element 12 which is arranged on the surface of the substrate 1 in regions other than those directly below spiral wiring portions 5 and 7. By forming the spiral inductor with such a structure, it is possible to decrease the coupling of the spiral wiring portions 5, 7 and the substrate 1 while suppressing dishing due to the CMP to the minimum. As a result, the leakage of high-frequency waves can be reduced, and the Q-value of the inductor can be maintained to be a large value.

The size of the spiral inductor 10 is hundreds $\mu$m square. Other constructions of the spiral inductor 10 are substantially the same as those of the spiral inductor 100 shown in FIGS. 19 and 20. While the inductor in this embodiment has used the wiring extending over two layers, a multi-layer metallization extending over three or more layers may be used. This point is the same with respect to any one of embodiments of the present invention which will be described below.

(2) Second Embodiment

Figure 3:
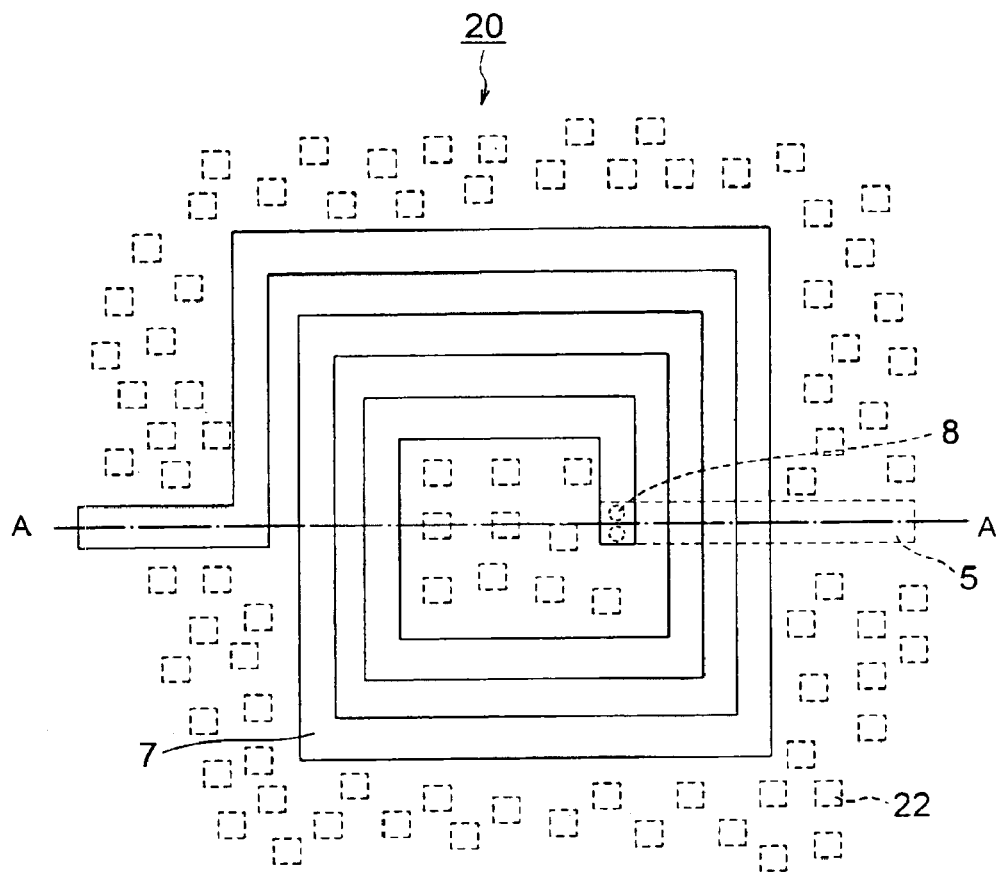
FIG. 3 is a plan view of the second embodiment of a spiral inductor according to the present invention.
Figure 4:
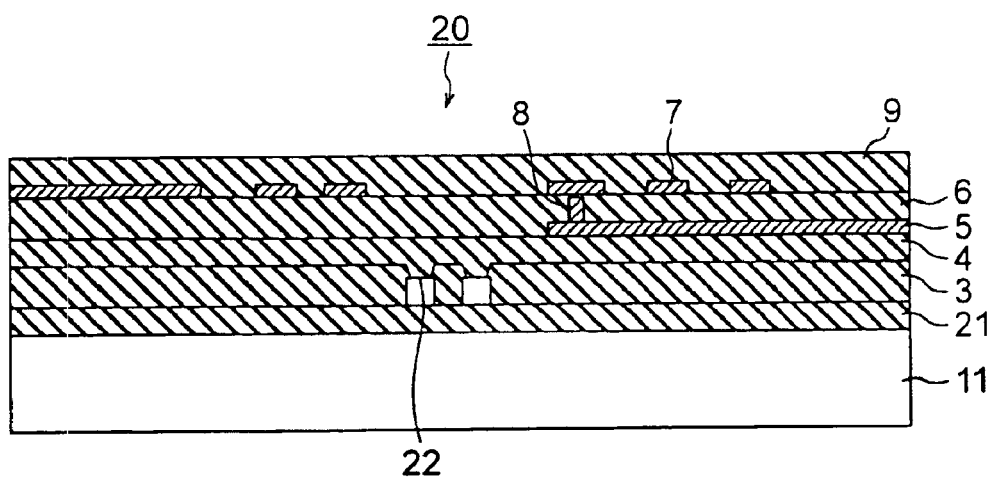
FIG. 4 is a schematic sectional view of the spiral inductor taken along line A—A of FIG. 3.

FIG. 3 is a plan view of the second embodiment of a spiral inductor according to the present invention, and FIG. 4 is a schematic sectional view taken along line A—A of FIG. 3. In this embodiment, the above described first embodiment is applied to an SOI (Silicon On Insulator) substrate.

A spiral inductor 20 in this embodiment comprises: a substrate 11; an insulating film 21 which is formed on the substrate 11; and a dummy element 22 which is formed by etching an SOI layer formed on the insulating film 21, in place of the substrate 1 and dummy element 12 of the spiral inductor 10 shown in FIGS. 1 and 2. The insulating film 21 is a buried oxide film for isolating the SOI layer from the supporting substrate 11. Other constructions of the spiral inductor 20 are substantially the same as those of the spiral inductor 10 shown in FIGS. 1 and 2. Similar to the dummy element 12 shown in FIGS. 1 and 2, the dummy element 22 is arranged in regions other than those directly below the spiral wiring portions 5 and 7.

According to this embodiment, by forming the spiral inductor with such a construction even in the SOI substrate, it is possible to decrease the coupling of the spiral wiring and the supporting substrate via the SOI layer while suppressing dishing due to the CMP to the minimum. As a result, the leakage of high-frequency waves can be reduced, and the Q-value of the inductor can be maintained to be a large value.

(3) Third Embodiment

Figure 5:
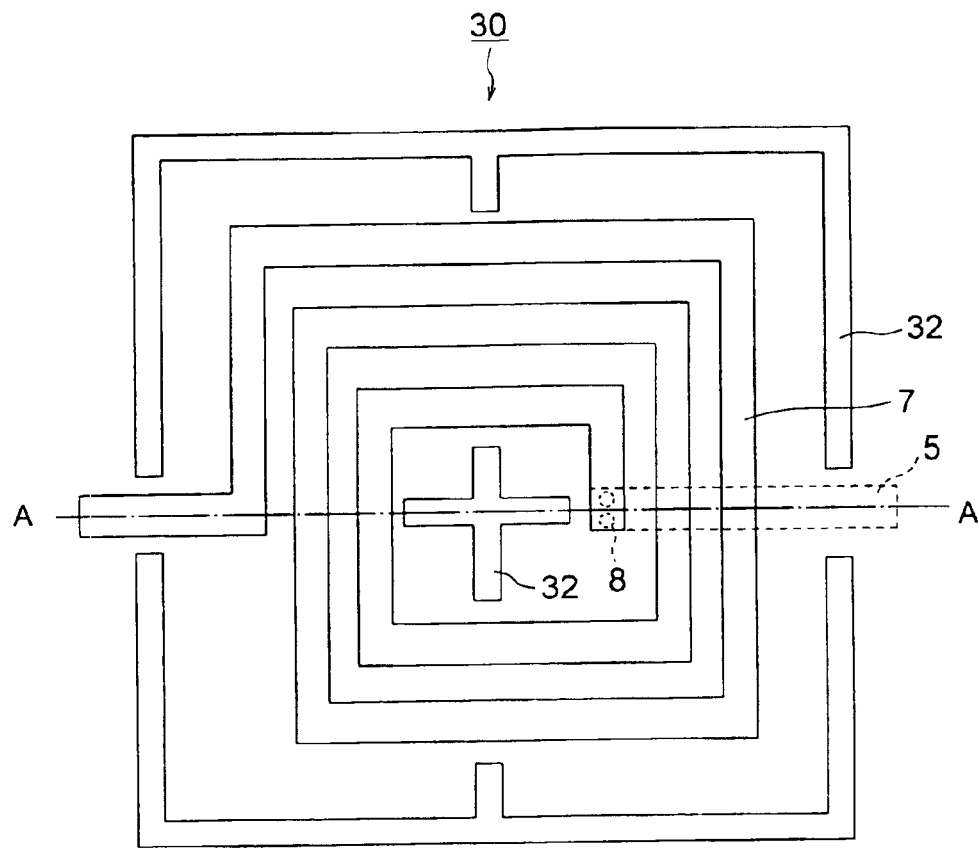
FIG. 5 is a plan view of the third embodiment of a spiral inductor according to the present invention.
Figure 6:
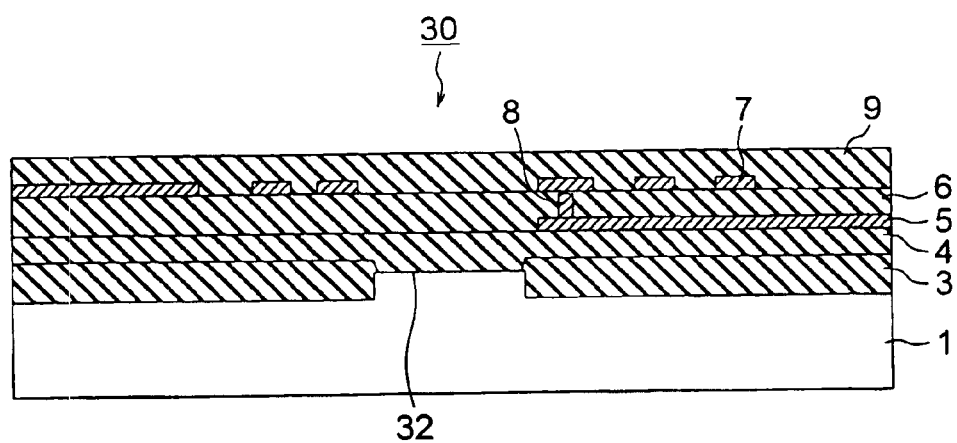
FIG. 6 is a schematic sectional view of the spiral inductor taken along line A—A of FIG. 5.

FIG. 5 is a plan view of the third embodiment of a spiral inductor according to the present invention, and FIG. 6 is a schematic sectional view taken along line A—A of FIG. 5.

The spiral inductor 30 shown in FIGS. 5 and 6 has a size of from about 100 $\mu$m square to about 200 $\mu$m square. As can be clearly seen from the comparison with FIGS. 1 and 2, the spiral inductor 30 has the lattice-shaped dummy element 32 with portions in regions corresponding to those directly below spiral wiring portions 5 and 7 being removed and the central and peripheral portions still remaining. Such a shape is particularly effective when the size of the inductor is relatively small as this embodiment. Other constructions of the spiral inductor 30 are substantially the same as those of the spiral inductor 10 shown in FIGS. 1 and 2.

Since the spiral inductor 30 in this embodiment thus has the lattice-shaped dummy element 32 from which portions in regions corresponding to those directly below the spiral wiring portions are removed, it is possible to decrease the coupling of the spiral wiring portions 5, 7 and the substrate 1 while suppressing dishing due to the CMP to the minimum. As a result, the leakage of high-frequency waves can be reduced, and the Q-value of the inductor can be maintained to be a large value.

(4) Fourth Embodiment

Figure 7:
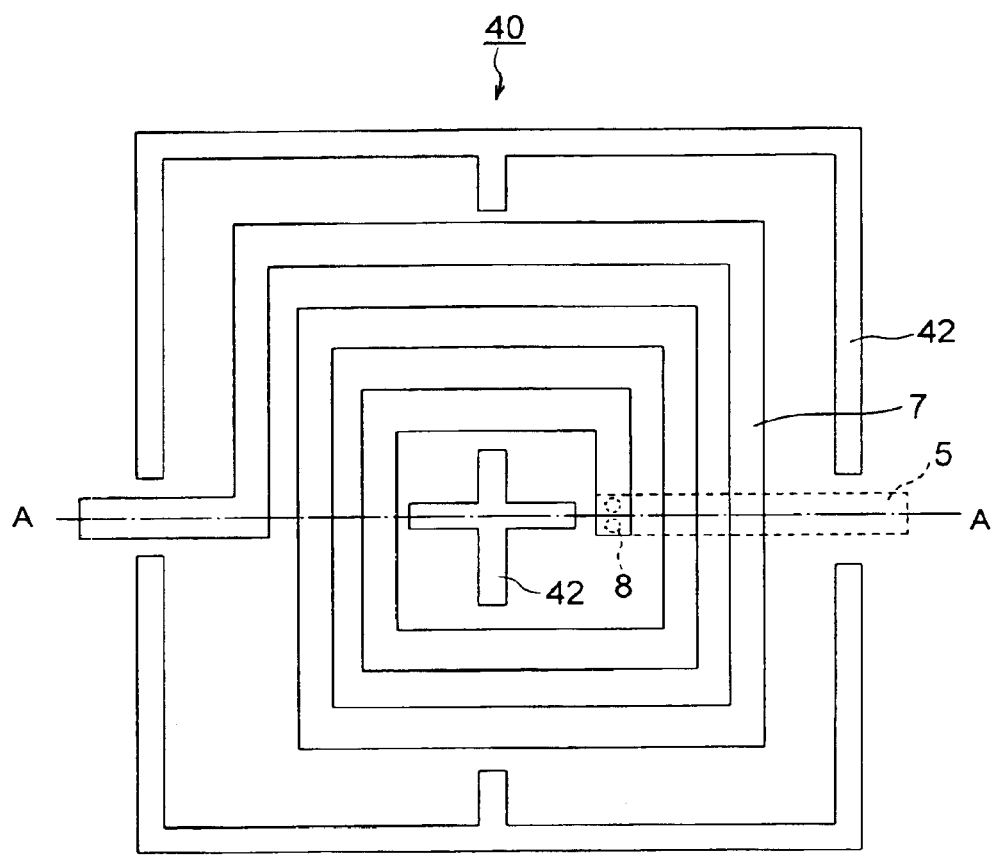
FIG. 7 is a plan view of the fourth embodiment of a spiral inductor according to the present invention.
Figure 8:
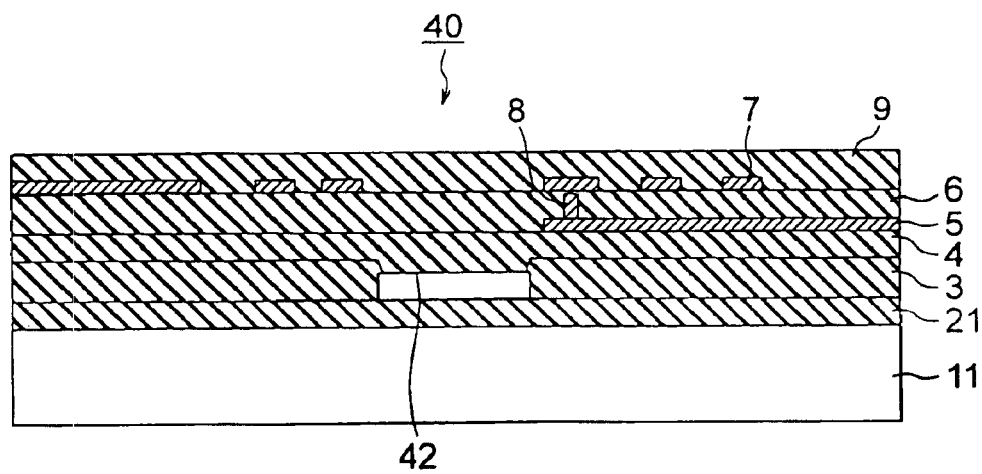
FIG. 8 is a schematic sectional view of the spiral inductor taken along line A—A of FIG. 7.

FIG. 7 is a plan view of the fourth embodiment of a spiral inductor according to the present invention, and FIG. 8 is a schematic sectional view taken along line A—A of FIG. 7. In this embodiment, the above described third embodiment is applied to an SOI substrate.

A spiral inductor 40 in this embodiment comprises: a substrate 11; an insulating film 21 which is formed on the substrate 11; and a dummy element 42 which is formed by etching an SOI layer formed on the insulating film 21, in place of the substrate 1 and dummy element 32 of the spiral inductor 30 shown in FIGS. 5 and 6. The insulating film 21 is a buried oxide film for isolating the SOI layer from the supporting substrate 11. The size and other constructions of the spiral inductor 40 are substantially the same as those of the spiral inductor 30 shown in FIGS. 5 and 6. Similar to the dummy element 32 shown in FIGS. 5 and 6, the dummy element 42 is arranged so as to have a lattice shape with portions in regions corresponding to those directly below the spiral wiring portions 5 and 7 being removed.

According to this embodiment, by forming the spiral inductor with such a construction even in the SOI substrate, it is possible to decrease the coupling of the spiral wiring and the supporting substrate via the SOI layer while suppressing dishing due to the CMP to the minimum. As a result, the leakage of high-frequency waves can be reduced, and the Q-value of the inductor can be maintained to be a large value.

(5) Fifth Embodiment

Figure 9:
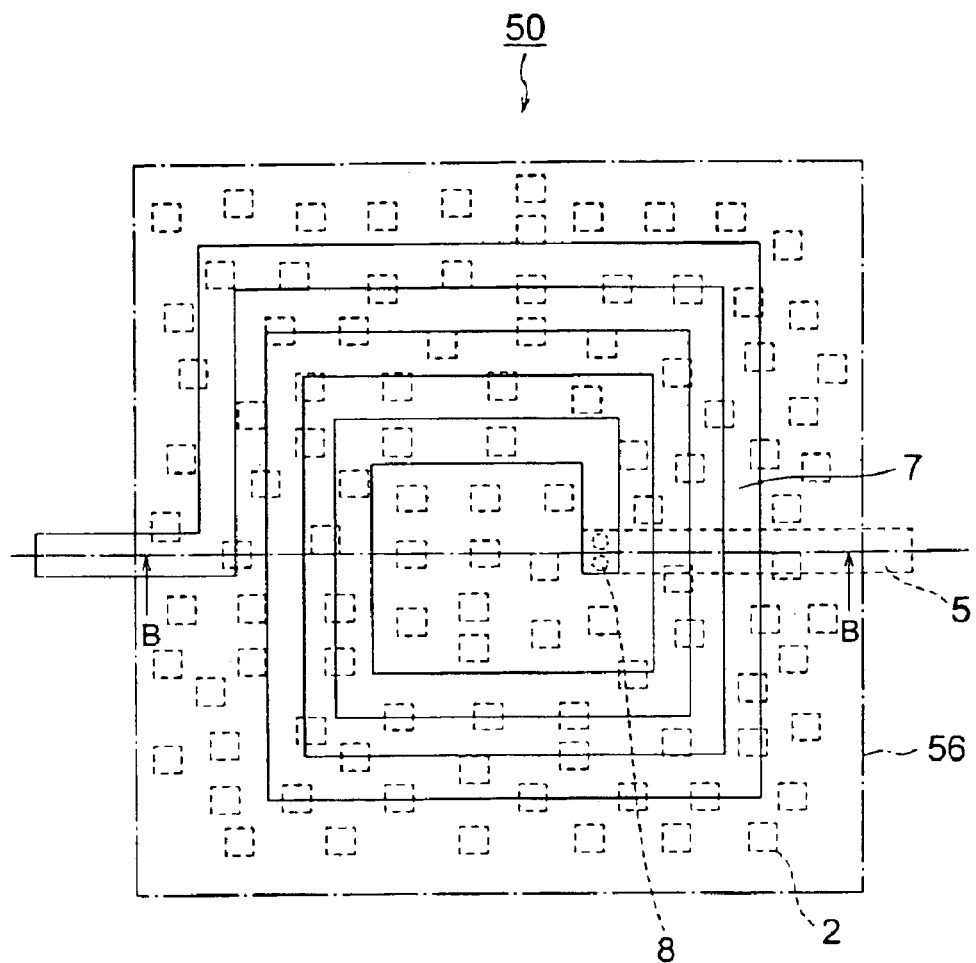
FIG. 9 is a plan view of the fifth embodiment of a spiral inductor according to the present invention.
Figure 10:
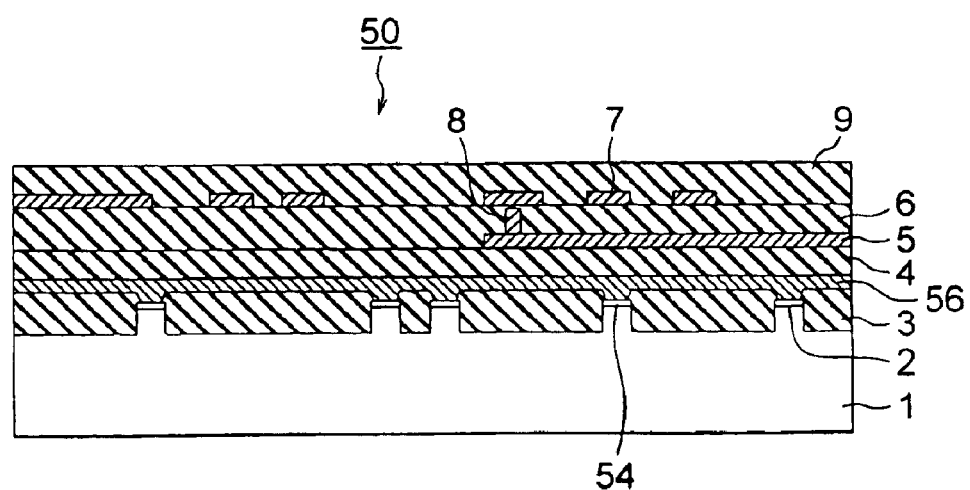
FIG. 10 is a schematic sectional view of the spiral inductor taken along line B—B of FIG. 9.

FIG. 9 is a plan view of the fifth embodiment of a spiral inductor according to the present invention, and FIG. 10 is a schematic sectional view taken along line B—B of FIG. 9.

Figure 19:
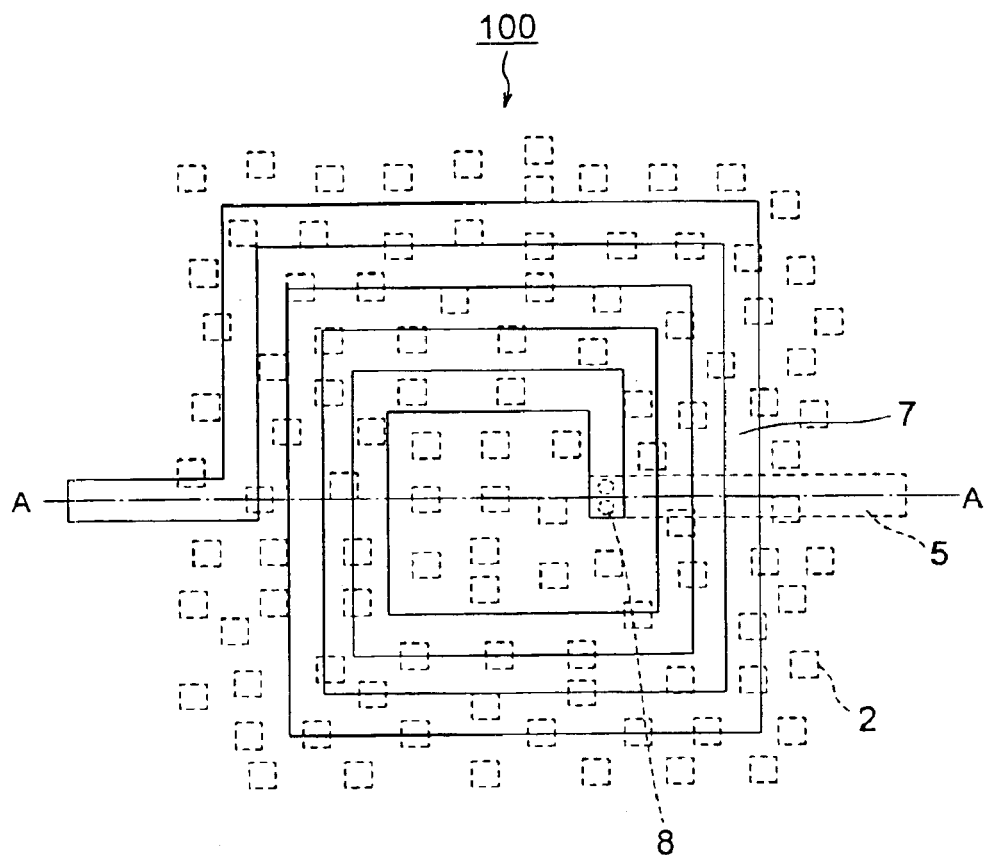
FIG. 19 is a plan view of an example of a conventional spiral inductor.
Figure 20:
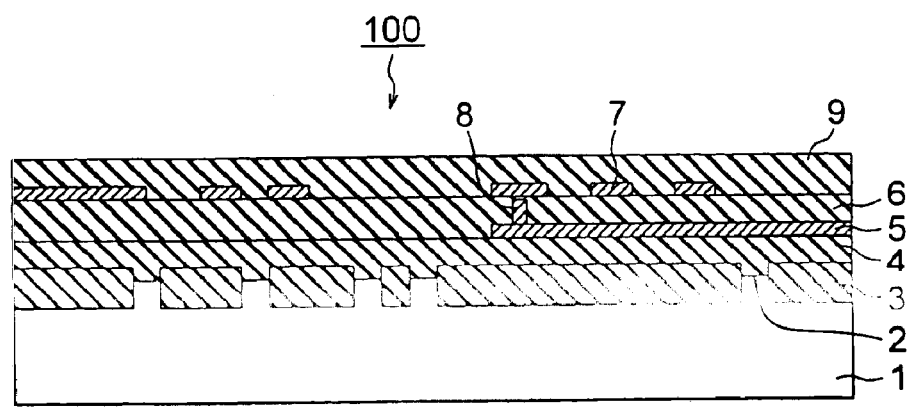
FIG. 20 is a sectional view of the spiral inductor taken along line A—A of FIG. 19.

As can be clearly seen from the comparison with FIGS. 19 and 20, the spiral inductor 50 shown in FIGS. 9 and 10 comprises a buffer oxide film 54 formed on the dummy element 2, and the protective film 56 formed in the inductor region on the substrate 1. The size and other constructions of the spiral inductor 50 are substantially the same as those of the spiral inductor 100 shown in FIGS. 19 and 20.

Since the spiral inductor 50 in this embodiment has the protective film 56 for covering the dummy element 2 in the inductor region, the dummy element 2 in the inductor region is not silicidated even in a process for silicidating an active element part which is formed in a region (not shown) on the substrate 1. Thus, it is possible to prevent the resistance of the dummy element 2 from decreasing. As a result, the coupling of the spiral wiring portions 5, 7 and the substrate 1 decreases, so that the leakage of high-frequency waves can be reduced and the Q-value of the inductor can be maintained to be a large value.

Referring to the schematic sectional views of FIGS. 11 and 13, a method for fabricating the spiral inductor 50 in this embodiment will be described below.

Figure 11:
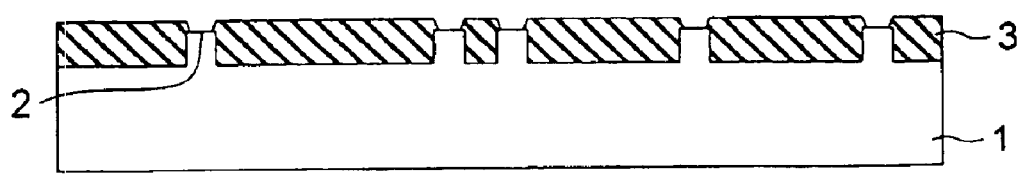
FIGS. 11 and 12 are schematic sectional views for explaining a method for fabricating the spiral inductor of FIG. 9.

First, as shown in FIG. 11, a shallow groove for forming a dummy element 2 is formed in the surface of a substrate 1. Then, an insulating film 3 serving as a filling material is deposited on the whole surface, and the surface of the dummy element 2 is exposed by the planarization CMP.

Figure 12:
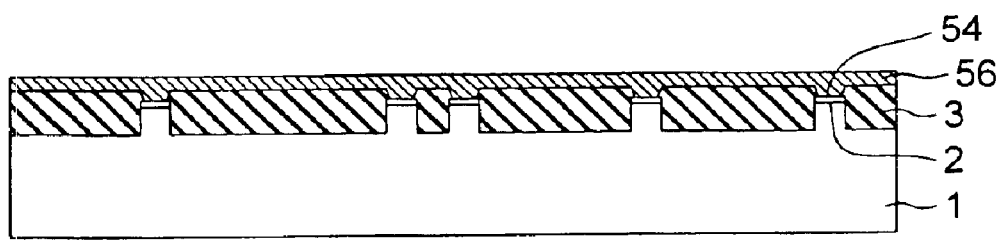

Then, by a device process, such as the formation of a gate oxide film, a buffer oxide film 54 is formed on the surface of the dummy element 2 as shown in FIG. 12. Thereafter, a silicon nitride film is formed on the buffer oxide film 54. Then, by patterning using a photoresist, the silicon nitride film is selectively removed so as to remain in an inductor region, thereby forming a protective film 56.

Thereafter, in other regions (not shown) on the substrate 1, the resistance of the dummy element 2 is decreased by a silicidation process. However, the dummy element 2 in the inductor region is not silicidated since it is covered and protected by the protective film 56 of silicon nitride. Therefore, since the resistance of the dummy element 2 in the inductor region is not decreased, it is possible to prevent inductor characteristics from deteriorating.

Thereafter, by known processes, an insulating film 4, an extracting wiring 5, an insulating film 6, a via hole 8, a second layer wiring 7 and a protective film 9 are formed to complete a spiral inductor 50 as shown in FIG. 10.

While the silicidation preventing protective film 56 has remained in the inductor region in the above described method for fabricating the spiral inductor, this may be removed after the silicidation process is completed. This point is the same in the sixth through eighth embodiments which will be described below.

(6) Sixth Embodiment

Figure 13:
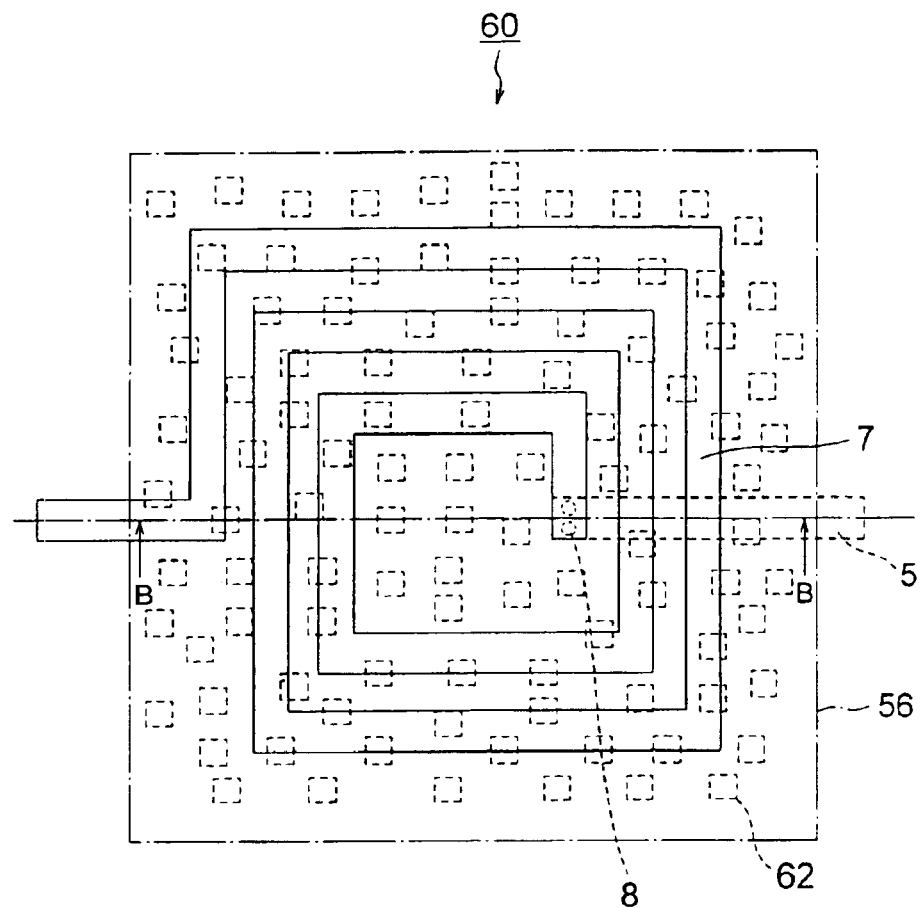
FIG. 13 is a plan view of the sixth embodiment of a spiral inductor according to the present invention.
Figure 14:
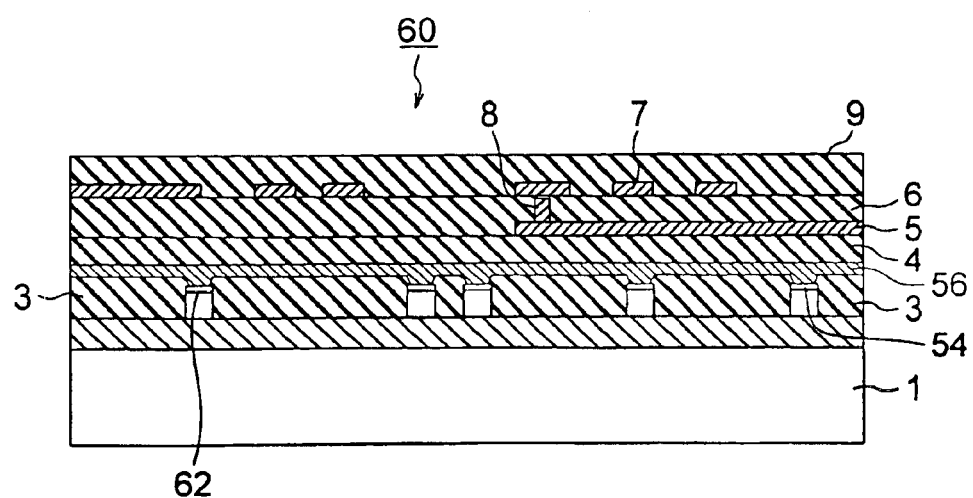
FIG. 14 is a schematic sectional view of the spiral inductor taken along line B—B of FIG. 13.

FIG. 13 is a plan view of the sixth embodiment of a spiral inductor according to the present invention, and FIG. 14 is a schematic sectional view taken along line B—B of FIG. 13. In this embodiment, the above described fifth embodiment is applied to an SOI substrate.

A spiral inductor 60 in this embodiment comprises: a substrate 11; an insulating film 21 which is formed on the substrate 11; and a dummy element 62 which is formed by etching an SOI layer formed on the insulating film 21, in place of the substrate 1 and dummy element 2 of the spiral inductor 50 shown in FIGS. 9 and 10. The insulating film 21 is a buried oxide film for isolating the SOI layer from the supporting substrate 11. The size and other constructions of the spiral inductor 60 are substantially the same as those of the spiral inductor 50 shown in FIGS. 9 and 10. Similar to the above described dummy element 2, the dummy element 62 in the inductor region is covered with a protective film so as not to be silicidated.

Thus, by forming the silicidation preventing protective film 56 even if the SOI substrate is used, it is possible to prevent the resistance of the dummy element 2 below the spiral wiring from decreasing. As a result, the coupling of the spiral wiring portions 5, 7 and the substrate 1 decreases, so that the leakage of high-frequency waves can be reduced and the Q-value of the inductor can be maintained to be a large value.

(7) Seventh Embodiment

In the above described embodiments, the embodiments wherein the dummy element is arranged in regions other than those directly below the spiral wiring, and the embodiments wherein the non-silicidating protective film is formed in the dummy element in the region in which the spiral inductor is formed, have been separately described. However, since these embodiments are never selective, combinations thereof are more effective.

Figure 15:
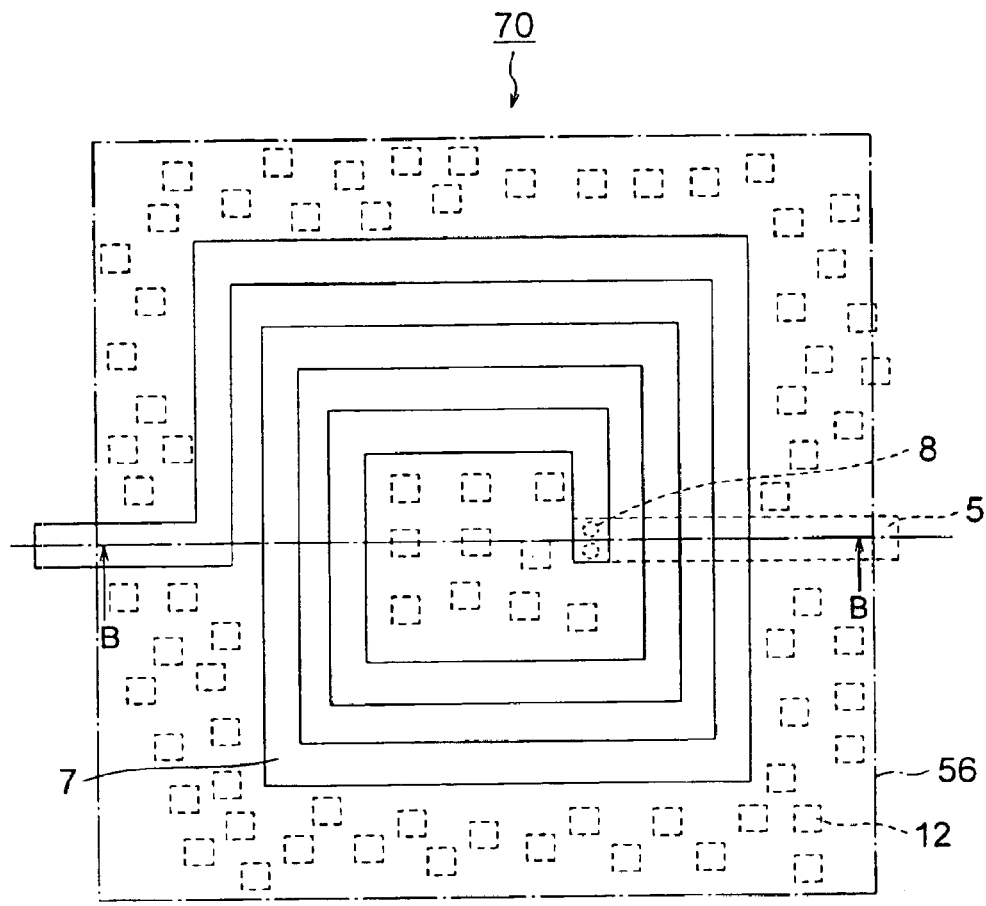
FIG. 15 is a plan view of the seventh embodiment of a spiral inductor according to the present invention.
Figure 16:
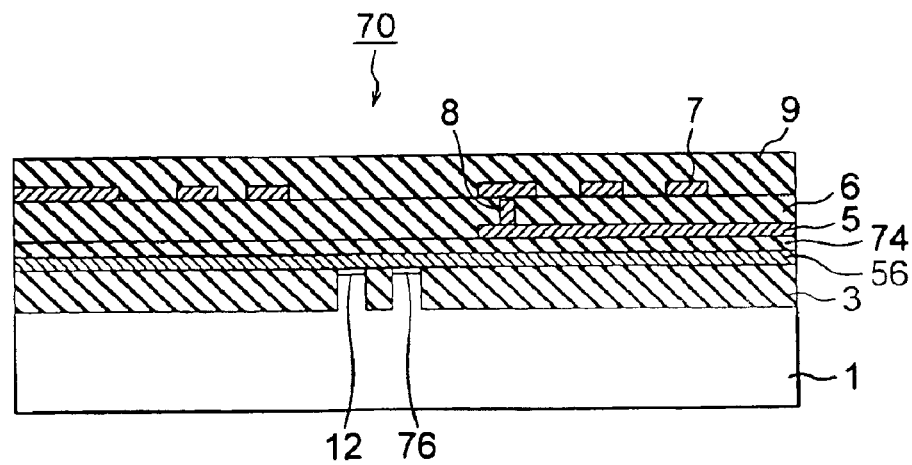
FIG. 16 is a schematic sectional view of the spiral inductor taken along line B—B of FIG. 15.

FIG. 15 is a plan view of the seventh embodiment of a spiral inductor according to the present invention, and FIG. 16 is a schematic sectional view taken along line B—B of FIG. 15. This embodiment is a combination of the above described first and fifth embodiments.

That is, a spiral inductor 70 shown in FIGS. 15 and 16 comprises: a dummy element 12 which is arranged in regions other than those directly below inductor wiring portions 5, 7; a buffer oxide film 76 which is formed on the dummy element 12; and a protective film 56 for preventing silicidation of the dummy element 12 in the inductor region. The size and other constructions of the spiral inductor 70 are substantially the same as those of the spiral inductor 10 shown in FIGS. 1 and 2.

Thus, according to this embodiment, the dummy element 12 is arranged in regions other than those directly below the spiral wiring portions 5, 7, and the protective film 56 is provided for preventing silicidation of the dummy element 12 in the inductor region, so that the coupling of the spiral wiring portions 5, 7 and the substrate 1 decreases. As a result, the leakage of high-frequency waves can be reduced, and the Q-value of the inductor can be maintained to be a large value.

(8) Eighth Embodiment

Figure 17:
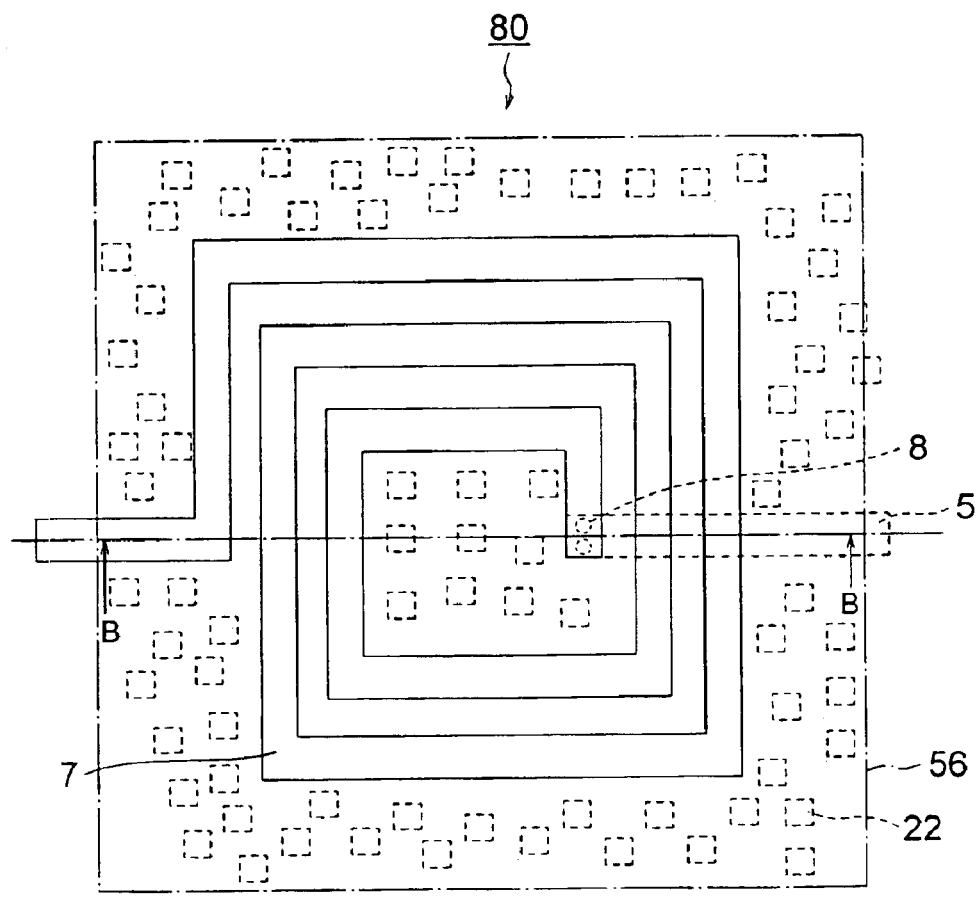
FIG. 17 is a plan view of the eighth embodiment of a spiral inductor according to the present invention.
Figure 18:
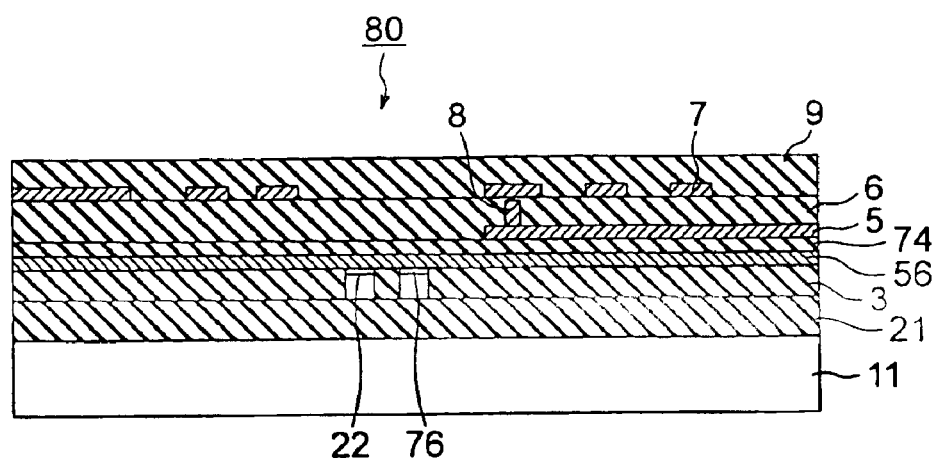
FIG. 18 is a schematic sectional view of the spiral inductor taken along line B—B of FIG. 17.

FIG. 17 is a plan view of the eighth embodiment of a spiral inductor according to the present invention, and FIG. 18 is a schematic sectional view taken along line B—B of FIG. 17. In this embodiment, the above described seventh embodiment is applied to an SOI substrate.

A spiral inductor 80 shown in FIGS. 17 and 18 comprises: a substrate 11; an insulating film 21 which is a buried oxide film formed on the substrate 11; and a dummy element 22 which is formed by etching an SOI layer formed on the insulating film 21, in place of the substrate 1 and dummy element 2 of the spiral inductor 70 shown in FIGS. 15 and 16. The size and other constructions of the spiral inductor 80 are substantially the same as those of the spiral inductor 70 shown in FIGS. 15 and 16. Similar to the dummy element 12 shown in FIGS. 15 and 16, the dummy element 22 is arranged in regions other than those directly below spiral wiring portions 5, 7, and a protective film 56 for preventing silicidation of the dummy element 22 is provided on the dummy element 22 in the inductor region.

According to this embodiment, by forming the spiral inductor with such a construction even in the SOI substrate, it is possible to decrease the coupling of the spiral wiring and the supporting substrate via the SOI layer while suppressing dishing due to the CMP to the minimum. As a result, the leakage of high-frequency waves can be reduced, and the Q-value of the inductor can be maintained to be a large value.

While some embodiments of the present invention have been described, the present invention should not be limited to the above described embodiments, but the invention can be embodied in various ways without departing from the principle of the invention. For example, while the spiral wiring has had the rectangular spiral shape, the present invention should not be limited thereto, but the invention may be applied to a circular or octagonal wiring. In addition, the shape of the dummy element should not be limited to the rectangle, but it may be circular. Moreover, the substrate may be a semiconductor substrate or an insulating substrate. In the case of a semiconductor substrate, it may include an N-type semiconductor layer or a P-type semiconductor layer.

What is claimed is:

1. A method for fabricating a semiconductor integrated circuit device comprising a substrate, and a spiral inductor which is formed on the substrate and which includes a spiral conductive layer serving as an induction element, said method comprising: forming an element isolating groove in the surface of the substrate so that a plurality of protruding portions are formed only in a region other than the region directly below said conductive layer, the top of said protruding portion serving as a dummy element for controlling a chemical mechanical polishing process.

2. A method for fabricating a semiconductor integrated circuit device as set forth in claim 1, wherein the substrate is an SOI substrate, and said protruding portion is formed of an SOI layer of said SOI substrate.

3. A method for fabricating a semiconductor integrated circuit device comprising a substrate, and a spiral inductor which is formed on the substrate so as to have a spiral shape and which includes a conductive layer serving as an induction element, said method comprising: forming an element isolating groove in the surface of the substrate so that a plurality of protruding portions are formed only in a region other than a region directly below said conductive layer, the top thereof serving as a dummy element for controlling a chemical mechanical polishing process; depositing a protective film on the substrate; selectively removing said protective film in a region other than a region in which said induction element is to be formed, by patterning using a photoresist; and silicidating the surface of the substrate.

4. A method for fabricating a semiconductor integrated circuit device as set forth in claim 3, wherein the substrate is an SOI substrate, and said protruding portion is formed of an SOI layer of said SOI substrate.

5. A method for fabricating a semiconductor integrated circuit device as set forth in claim 3, wherein said protruding portion is formed in a region other than a region directly below said conductive layer.

6. A method for fabricating a semiconductor integrated circuit as set forth in claim 5, wherein the substrate is an SOI substrate, and said protruding portion is formed of an SOI layer of said SOI substrate.

* * * * *